US009270259B2

(12) United States Patent
Chang (10) Patent No.: US 9,270,259 B2
(45) Date of Patent: Feb. 23, 2016

(54) TRIMMING CIRCUIT AND METHOD APPLIED TO VOLTAGE GENERATOR

(71) Applicant: eMemory Technology Inc., Hsin-Chu (TW)

(72) Inventor: Che-Wei Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 114 days.

(21) Appl. No.: 14/280,973

(22) Filed: May 19, 2014

(65) Prior Publication Data

US 2015/0333744 A1    Nov. 19, 2015

(51) Int. Cl.
*H03K 4/06* (2006.01)
*H03K 5/08* (2006.01)
*H02M 3/07* (2006.01)

(52) U.S. Cl.
CPC .. *H03K 5/08* (2013.01); *H02M 3/07* (2013.01)

(58) Field of Classification Search
CPC .................................. H03K 5/08; H02M 3/07
USPC .......................................... 327/309, 131, 140
See application file for complete search history.

(56) References Cited

U.S. PATENT DOCUMENTS

| | | | | |
|---|---|---|---|---|
| 6,141,262 A * | 10/2000 | Sudo | .................. | G11C 16/08 365/189.09 |
| 6,570,368 B2 * | 5/2003 | Demizu | ................ | H02M 3/156 323/282 |
| 7,199,645 B2 * | 4/2007 | Chang | .................. | H02M 3/073 327/538 |
| 7,705,570 B2 | 4/2010 | Brown et al. | | |
| 8,791,676 B2 * | 7/2014 | Liu | .......................... | G06F 1/266 323/282 |
| 8,842,484 B2 * | 9/2014 | Kwon | .................... | G11C 5/145 365/189.07 |
| 8,963,589 B1 * | 2/2015 | Ferrario | ........................ | 327/131 |
| 9,141,119 B2 * | 9/2015 | Tercariol | ................... | G05F 1/46 |
| 2004/0222775 A1 * | 11/2004 | Muramatsu | ............. | H02M 3/07 323/282 |
| 2008/0191795 A1 | 8/2008 | Dharmalinggam et al. | | |
| 2010/0321956 A1 | 12/2010 | Yeh | | |
| 2012/0063244 A1 * | 3/2012 | Kwon | .................... | G11C 5/145 365/189.07 |
| 2012/0326630 A1 * | 12/2012 | Seo | ..................... | H05B 33/0815 315/297 |
| 2015/0070053 A1 * | 3/2015 | Kim | ......................... | G05F 1/465 327/108 |

OTHER PUBLICATIONS

Taiwan Intellectual Property Office, "Office Action" issued N0v. 3, 2015.

\* cited by examiner

*Primary Examiner* — Ryan Jager
(74) *Attorney, Agent, or Firm* — WPAT, P.C.; Justin King (57) ABSTRACT

A trimming method for a voltage generator is provided. The voltage generator generates an output voltage according to a reference voltage. The trimming method includes the following steps. Firstly, in a step (a), an initial value of a trimming code is provided. Then, in a step (b), the reference voltage is generated to the voltage generator according to the trimming code, so that the output voltage is correspondingly generated by the voltage generator. Then, in a step (c), an average voltage of the output voltage is compared with a target voltage. If the average voltage does not reach the target voltage, the trimming code is gradually changed, and the step (b) is repeatedly done. If the average voltage reaches the target voltage, the trimming code is locked.

11 Claims, 5 Drawing Sheets

TRIMMING CIRCUIT AND METHOD APPLIED TO VOLTAGE GENERATOR

FIELD OF THE INVENTION

The present invention relates to a trimming circuit and a trimming method, and more particularly to a trimming circuit and a trimming method for a voltage generator such as a charge pumping circuit.

BACKGROUND OF THE INVENTION

Generally, an integrated circuit has to receive various supply voltages. A charge pumping circuit is a voltage generator that is installed in the integrated circuit. According to the practical requirements, the voltage generator provides various voltages. Generally, according to a pumping clock signal, a specified voltage is increased to a higher pumping output voltage in a stagewise fashion by the charge pumping circuit.

Figure 1A:
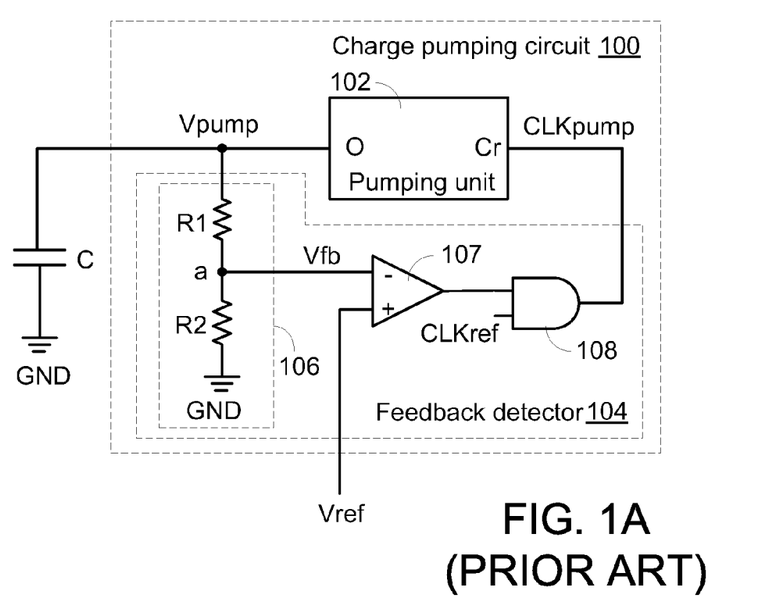
FIG. 1A (prior art) is a schematic circuit diagram illustrating a conventional charge pumping circuit.
Figure 1B:
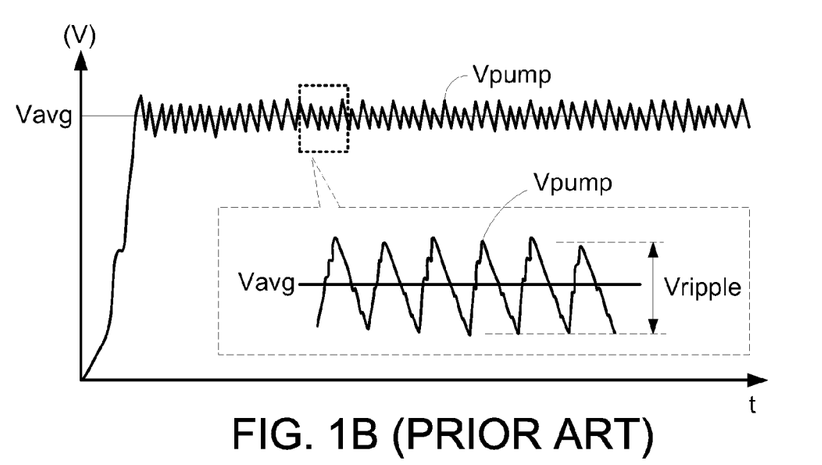
FIG. 1B (prior art) is a schematic timing waveform diagram illustrating associated signals processed by the charge pumping circuit of FIG. 1A.

FIG. 1A is a schematic circuit diagram illustrating a conventional charge pumping circuit. FIG. 1B is a schematic timing waveform diagram illustrating associated signals processed by the charge pumping circuit of FIG. 1A.

As shown in FIG. 1A, the charge pumping circuit 100 comprises a pumping unit 102 and a feedback detector 104. A pumping clock signal CLKpump is received by a control terminal Cr of the pumping unit 102, and a pumping output signal Vpump is outputted from an output terminal O of the pumping unit 102. Moreover, the output terminal O of the pumping unit 102 is connected with a capacitor C.

Generally, the pumping output signal Vpump is controlled according to the pumping clock signal CLKpump. That is, the voltage level of the pumping output signal Vpump is gradually increased when the pumping clock signal CLKpump is activated; and the voltage level of the pumping output signal Vpump is gradually decreased when the pumping clock signal CLKpump is inactivated. Consequently, the pumping clock signal CLKpump is selectively activated or inactivated by the feedback detector 104 of the charge pumping circuit 100.

The feedback detector 104 comprises a voltage divider 106, a comparator 107, and an AND gate 108. The voltage divider 106 comprises two resistors R1 and R2. The two resistors R1 and R2 are connected between the output terminal O of the pumping unit 102 and a ground terminal GND. A feedback voltage Vfb is outputted from a node a between the two resistors R1 and R2. Moreover, the feedback voltage Vfb is inputted into a negative input terminal of the comparator 107. A reference voltage Vref is inputted into a positive input terminal of the comparator 107. Moreover, a first input terminal of the AND gate 108 is connected with an output terminal of the comparator 107, a reference clock signal CLKref is received by a second input terminal of the AND gate 108, and the pumping clock signal CLKpump is outputted from an output terminal of the AND gate 108.

If the feedback voltage Vfb is lower than the reference voltage Vref, the comparator 107 outputs a high level to the AND gate 108. Consequently, the clock signal CLKpump is activated. On the other hand, if the feedback voltage Vfb is higher than the reference voltage Vref, the comparator 107 outputs a low level to the AND gate 108. Consequently, the clock signal CLKpump is inactivated. Moreover, the relation between the pumping output signal Vpump and the reference voltage Vref may be expressed by the following equation:

$$Vref = Vfb = \left(\frac{R2}{R1+R2}\right) \times Vpump$$

Please refer to FIG. 1B. Since the pumping clock signal CLKpump is selectively activated or inactivated under control of the feedback detector 104, the pumping output signal Vpump outputted from the pumping unit 102 fluctuates relative to an average voltage Vavg in a DC form. Consequently, Vpump=Vavg+Vripple, wherein Vripple is the amplitude of a ripple voltage in an AC form.

For allowing the charge pumping circuit 100 to generate a predetermined value of the average DC voltage Vavg, the reference voltage Vref should be manually adjusted before the IC chip leaves the factory. That is, the pumping output signal Vpump is changed until the average DC voltage Vavg of the pumping output signal Vpump reaches the predetermined value.

Obviously, the way of manually adjusting the pumping output signal Vpump is time-consuming and labor-intensive.

SUMMARY OF THE INVENTION

The present invention provides a trimming circuit and a trimming method for a voltage generator (e.g. a charge pumping circuit). The trimming circuit is capable of automatically searching an appropriate reference voltage Vref until an average voltage Vavg of a pumping output signal Vpump reaches a target voltage.

An embodiment of the present invention provides a trimming circuit for a voltage generator. The voltage generator generates an output voltage according to a reference voltage. The trimming circuit includes a controller, a reference voltage supply circuit, and an average voltage detector. The controller receives a control clock signal and a trimming finish signal, and generates a trimming code. If the trimming finish signal is inactivated, the trimming code is gradually changed from an initial value by the controller according to the control clock signal. If the trimming finish signal is activated, the trimming code is no longer changed. The reference voltage supply circuit is connected with the controller, and receiving the trimming code. A fixed voltage is converted into the reference voltage by the reference voltage supply circuit according to the trimming code. A magnitude of the reference voltage is in direct proportion to the trimming code. The average voltage detector is connected with the voltage generator, and receives the output voltage and a target voltage. The output voltage contains an average voltage in a DC form and a ripple voltage in an AC form. When the average voltage reaches the target voltage, the trimming finish signal is activated by the average voltage detector.

Another embodiment of the present invention provides a trimming method for a voltage generator. The voltage generator generates an output voltage according to a reference voltage. The trimming method includes the following steps. Firstly, in a step (a), an initial value of a trimming code is provided. Then, in a step (b), the reference voltage is generated to the voltage generator according to the trimming code, so that the output signal is correspondingly generated by the voltage generator. Then, in a step (c), an average voltage of the output voltage is compared with a target voltage. If the average voltage does not reach the target voltage, the trimming code is gradually changed, and the step (b) is repeatedly done. If the average voltage reaches the target voltage, the trimming code is locked.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figures 2A, 2B:
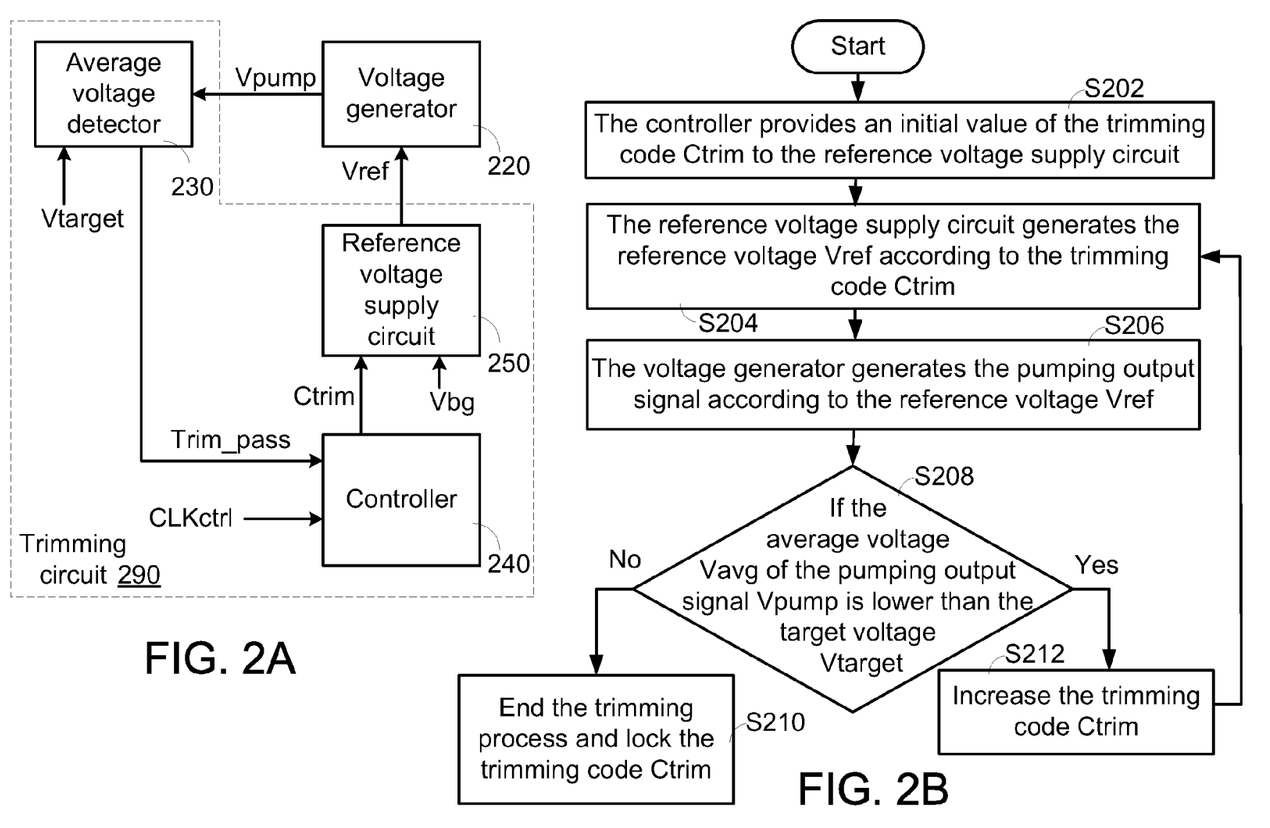
FIG. 2A is a schematic circuit diagram illustrating a trimming circuit for a voltage generator according to an embodiment of the present invention.
FIG. 2B is a flowchart illustrating a trimming method for a voltage generator according to an embodiment of the present invention.

FIG. 2A is a schematic circuit diagram illustrating a trimming circuit for a voltage generator according to an embodiment of the present invention. FIG. 2B is a flowchart illustrating a trimming method for a voltage generator according to an embodiment of the present invention.

The voltage generator 220 may have the configuration of the charge pumping circuit as shown in FIG. 1A. According to a reference voltage Vref, the voltage generator 220 generates an output voltage. The output voltage is the pumping output signal Vpump. The operating principle and the inner circuitry of the voltage generator 220 are identical to those of the charge pumping circuit, and are not redundantly described herein.

The trimming circuit 290 comprises an average voltage detector 230, a controller 240, and a reference voltage supply circuit 250. According to a control clock signal CLKctrl, a trimming code Ctrim is gradually increased from an initial value by the controller 240. In an embodiment, the controller 240 is an up counter. The counting value of the up counter is the trimming code Ctrim. The initial value of the up counter may be 0. Moreover, according to the control clock signal CLKctrl, the counting value (i.e. the trimming code Ctrim) is stepwise increased.

Moreover, according to a fixed voltage Vbg and the trimming code Ctrim, the reference voltage supply circuit 250 generates the reference voltage Vref. The magnitude of the reference voltage Vref is in direct proportion to the trimming code Ctrim. For example, the fixed voltage Vbg is a bandgap voltage generated by a bandgap reference circuit (not shown). After the reference voltage supply circuit 250 multiplies the fixed voltage Vbg by the trimming code Ctrim, the reference voltage Vref is generated. According to the reference voltage Vref, the voltage generator 220 generates the pumping output signal Vpump to the average voltage detector 230.

Moreover, the average voltage detector 230 may compare an average voltage Vavg of the pumping output signal Vpump with a target voltage Vtarget. If the average voltage Vavg is lower than the target voltage Vtarget, a trimming finish signal Trim_pass is inactivated. Under this circumstance, the controller 240 continuously changes the trimming code Ctrim according to the control clock signal CLKctrl. On the other hand, if the average voltage Vavg is not lower than the target voltage Vtarget, the trimming finish signal Trim_pass is activated. Under this circumstance, the trimming code Ctrim is locked by the controller 240, and the trimming code Ctrim is not changed with the control clock signal CLKctrl.

Please refer to FIG. 2B. After the trimming process of the trimming circuit 290 is started, the controller 240 provides the initial value of the trimming code Ctrim to the reference voltage supply circuit 250 (Step S202).

According to the trimming code Ctrim, the reference voltage supply circuit 250 generates the reference voltage Vref to the voltage generator 220 (Step S204). According to the reference voltage Vref, the voltage generator 220 generates the pumping output signal Vpump (Step S206).

Then, the average voltage detector 230 judges whether the average voltage Vavg of the pumping output signal Vpump is lower than the target voltage Vtarget (Step S208). If the average voltage Vavg is lower than the target voltage Vtarget, the trimming code Ctrim is increased (Step S212), and the step S204 is repeatedly done.

On the other hand, if the average voltage Vavg is not lower than the target voltage Vtarget, the trimming process is finished. Meanwhile, the trimming code Ctrim is locked by the controller 240 (Step S210). Consequently, the trimming code Ctrim, the reference voltage Vref and the pumping output signal Vpump are no longer changed.

Figure 3A:
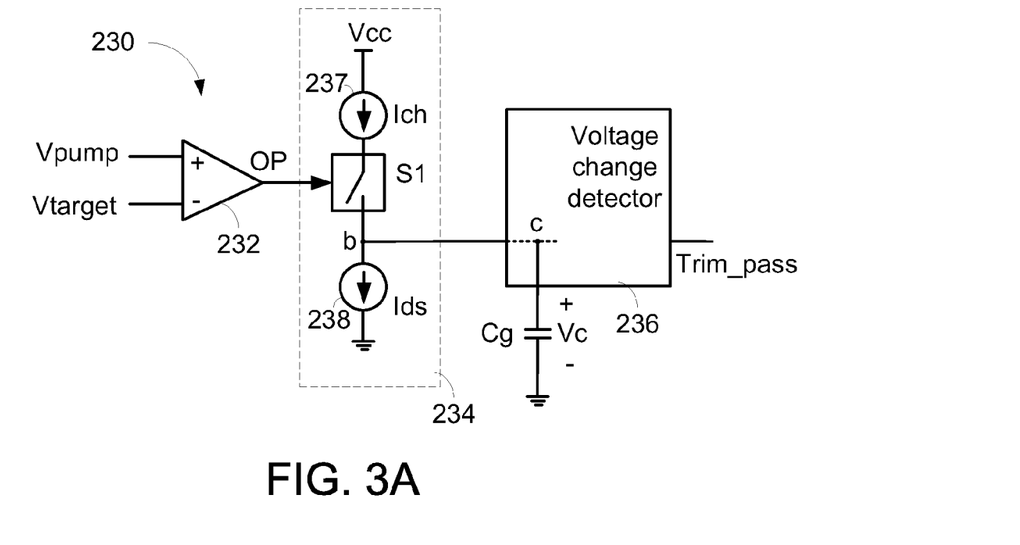
FIG. 3A is a schematic circuit diagram illustrating the average voltage detector of the trimming circuit according to the embodiment of the present invention.

FIG. 3A is a schematic circuit diagram illustrating the average voltage detector of the trimming circuit according to the embodiment of the present invention. As shown in FIG. 3A, the average voltage detector 230 comprises a comparator 232, a charge/discharge control circuit 234, an integral capacitor Cg, and a voltage change detector 236.

The comparator 232 is used for comparing the pumping output signal Vpump with the target voltage Vtarget, thereby generating an output pulse OP to the charge/discharge control circuit 234.

According to the output pulse OP, the integral capacitor Cg is selectively charged or discharged under control of the charge/discharge control circuit 234. In this embodiment, the charge/discharge control circuit 234 comprises a charging unit 237, a first switch element S1, and a discharging unit 238. The first switch element S1 is controlled according to the output pulse OP. The charging unit 237 provides a first current Ich, and the discharging unit 238 provides a second current Ids, wherein Ich=2×Ids.

In response to a first voltage level (e.g. a high voltage level) of the output pulse OP, the first switch element S1 is in a close state. Consequently, the integral capacitor Cg is charged by the charging unit 237. Meanwhile, a charging current is equal to Ids (i.e. Ich−Ids=2×Ids−Ids=Ids). Whereas, in response to a second voltage level (e.g. a low voltage level) of the output pulse OP, the first switch element S1 is in an open state. Consequently, the integral capacitor Cg is discharged by the discharging unit 238. Meanwhile, a discharging current is equal to the second current Ids.

Moreover, the change of a voltage Vc at a node c is detected by the voltage change detector 236. When the voltage change ΔVc detected by the voltage change detector 236 is zero, it is confirmed that the trimming process of the trimming circuit is finished. Under this circumstance, the trimming finish signal Trim_pass is activated.

Figure 3B:
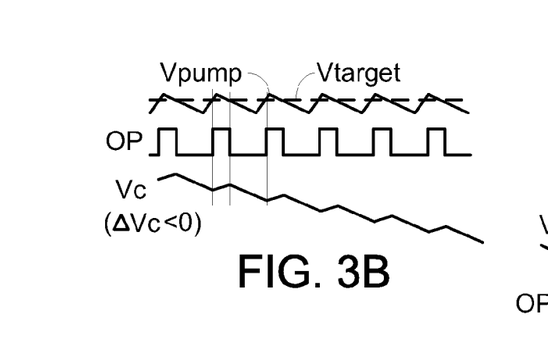
FIGS. 3B~3D are schematic timing waveform diagrams illustrating associated signals processed by the average voltage detector of FIG. 3A.
Figure 3C:
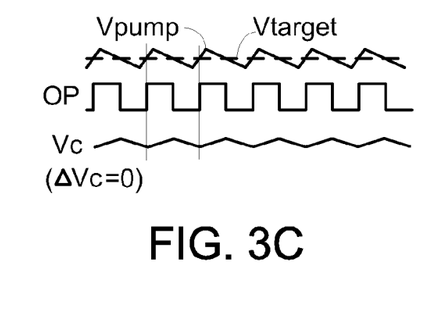
Figure 3D:
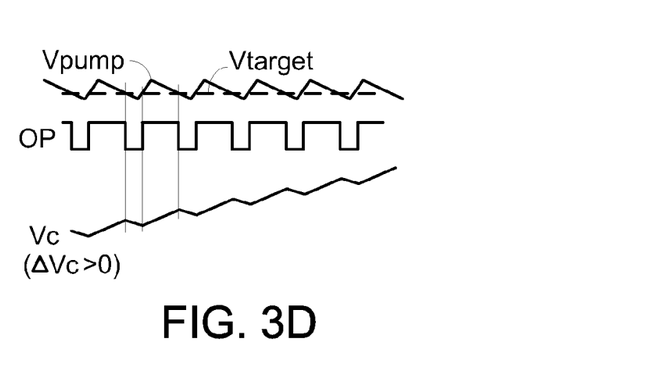

FIGS. 3B~3D are schematic timing waveform diagrams illustrating associated signals processed by the average voltage detector of FIG. 3A.

Please refer to FIG. 3B. In each cycle of the output pulse OP, the time period of the first voltage level (i.e. the high voltage level) is shorter than the time period of the second voltage level (i.e. the low voltage level) of the output pulse OP. That is, the duty cycle of the output pulse OP is smaller than 50%. Under this circumstance, the discharging period of the integral capacitor Cg is longer than the charging period of the integral capacitor Cg. Consequently, the number of charges in the integral capacitor Cg is gradually decreased and the voltage Vc at a node c is gradually decreased. That is, the voltage change ΔVc is lower than zero. In addition, the average voltage Vavg of the pumping output signal Vpump has not reached the target voltage Vtarget.

Please refer to FIG. 3C. In each cycle of the output pulse OP, the time period of the first voltage level (i.e. the high voltage level) is equal to the time period of the second voltage level (i.e. the low voltage level) of the output pulse OP. That is, the duty cycle of the output pulse OP is equal to 50%. Under this circumstance, the discharging period of the integral capacitor Cg is equal to the charging period of the integral capacitor Cg. Consequently, the number of charges in the integral capacitor Cg maintains stable and the voltage Vc at a node c is also in a stable state. That is, the voltage change ΔVc is equal to zero. In addition, the average voltage Vavg of the pumping output signal Vpump reaches the target voltage Vtarget.

Please refer to FIG. 3D. In each cycle of the output pulse OP, the time period of the first voltage level (i.e. the high voltage level) is longer than the time period of the second voltage level (i.e. the low voltage level) of the output pulse OP. That is, the duty cycle of the output pulse OP is larger than 50%. Under this circumstance, the discharging period of the integral capacitor Cg is shorter than the charging period of the integral capacitor Cg. Consequently, the number of charges in the integral capacitor Cg is gradually increased and the voltage Vc at a node c is gradually increased. That is, the voltage change ΔVc is higher than zero. In addition, the average voltage Vavg of the pumping output signal Vpump exceeds the target voltage Vtarget.

In other words, during the trimming process of the trimming circuit 290, the pumping output signal Vpump is gradually increased. In addition, the average voltage detector 230 continuously compares the average voltage Vavg of the pumping output signal Vpump with the target voltage Vtarget. When the average voltage detector 230 confirms that the average voltage Vavg reaches the target voltage Vtarget, the trimming finish signal Trim_pass is activated. Under this circumstance, the locked trimming code Ctrim is a target trimming code.

Figure 4:
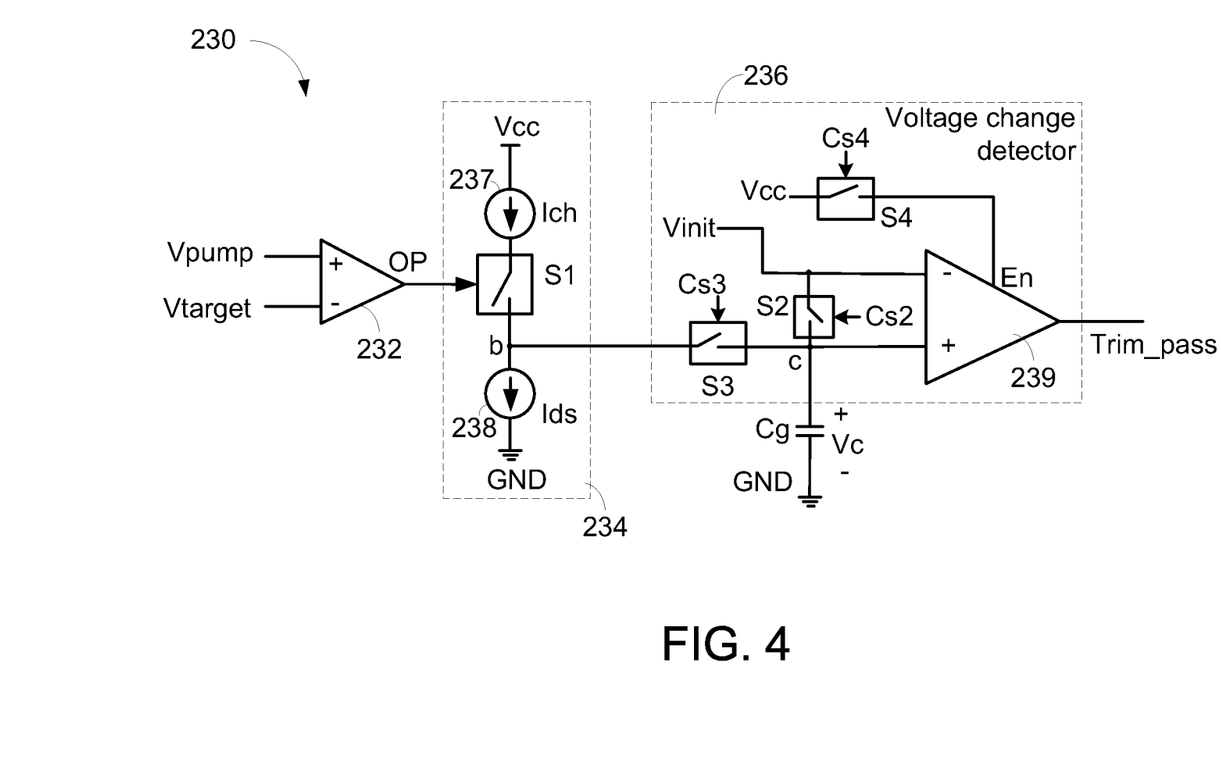
FIG. 4 is a schematic circuit diagram illustrating the detailed circuitry of the average voltage detector of the trimming circuit according to the embodiment of the present invention.

FIG. 4 is a schematic circuit diagram illustrating the detailed circuitry of the average voltage detector of the trimming circuit according to the embodiment of the present invention. The voltage change detector 236 comprises a second switch element S2, a third switch element S3, a fourth switch element S4, and a comparator 239. A first input terminal of the comparator 239 receives an initial voltage Vinit, a second input terminal of the comparator 239 is connected with the node c and the integral capacitor Cg, and an output terminal of the comparator 239 generates the trimming finish signal Trim_pass. The second switch element S2 is connected between the first input terminal and the second input terminal of the comparator 239. The third switch element S3 is connected between the node b and the node c. The fourth switch element S4 is connected between an enabling terminal of the comparator 239 and a power supply voltage Vcc. Moreover, the second switch element S2 is controlled according to a second switch signal Cs2, the third switch element S3 is controlled according to a third switch signal Cs3, and the fourth switch element S4 is controlled according to a fourth switch signal Cs4.

The switch signals Cs2, Cs3 and Cs4 of the average voltage detector 230 have plural voltage detecting cycles. Each voltage detecting cycle comprises three phases.

During the first phase, the second switch element S2 is in the close state, the third switch element S3 is in the open state, and the fourth switch element S4 is in the open state. Meanwhile, the integral capacitor Cg is pre-charged to the initial voltage Vinit.

The second phase is posterior to the first phase. In the second phase, the second switch element S2 is in the open state, the third switch element S3 is in the close state, and the fourth switch element S4 is in the open state. Meanwhile, the integral capacitor Cg is connected to the node b. Consequently, the integral capacitor Cg starts to receive the charging current and the discharging current from the charge/discharge control circuit 234.

The third phase is posterior to the second phase. In the third phase, the second switch element S2 is in the open state, the third switch element S3 is in the open state, and the fourth switch element S4 is in the close state. Meanwhile, the comparator 239 is enabled to compare the initial voltage Vinit with the voltage Vc of the integral capacitor Cg.

If the initial voltage Vinit is higher than the voltage Vc of the integral capacitor Cg, it means that the voltage change ΔVc is lower than zero. Under this circumstance, the trimming finish signal Trim_pass with the low voltage level is outputted from the comparator 239 and indicates that the trimming finish signal Trim_pass is inactivated.

If the initial voltage Vinit is lower than the voltage Vc of the integral capacitor Cg, it means that the voltage change ΔVc is higher than zero. Under this circumstance, the trimming finish signal Trim_pass with the high voltage level is outputted from the comparator 239 to indicate that the trimming finish signal Trim_pass is activated.

From the above descriptions, the trimming finish signal Trim_pass is inactivated while the pumping output signal Vpump is gradually increased. Until the average voltage Vavg of the pumping output signal Vpump reaches the target voltage Vtarget, the trimming finish signal Trim_pass is activated to indicate that the trimming process is finished.

Figure 5:
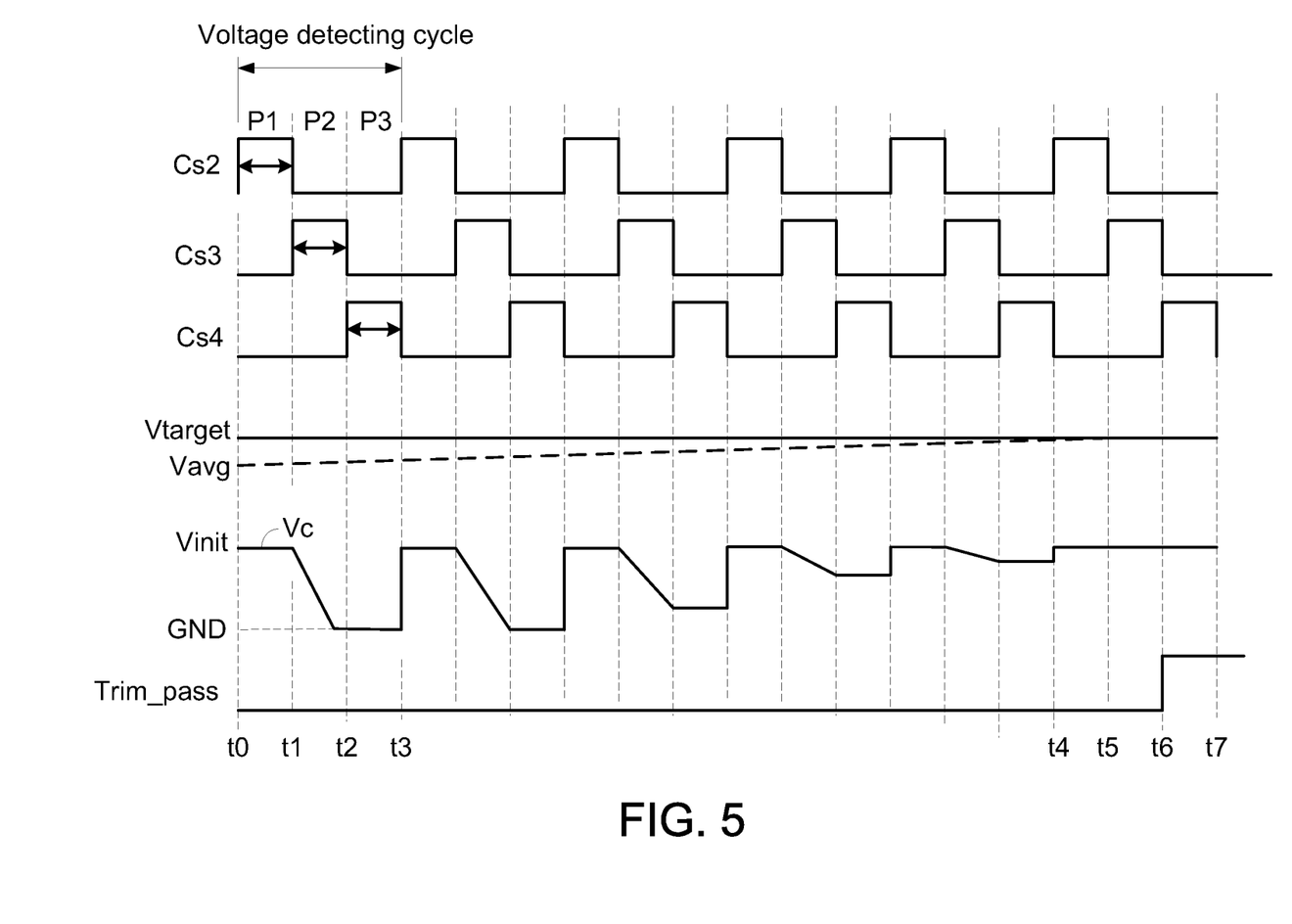
FIG. 5 is a schematic timing waveform diagram illustrating associated signals processed by the average voltage detector of the trimming circuit according to the embodiment of the present invention.

FIG. 5 is a schematic timing waveform diagram illustrating associated signals processed by the average voltage detector of the trimming circuit according to the embodiment of the present invention. As shown in FIG. 5, each voltage detecting cycle comprises the first phase P1, the second phase P2 and the third phase P3.

During the first phase P1 from the time point t0 to the time point t1, the integral capacitor Cg is pre-charged to the initial voltage Vinit.

During the second phase P2 from the time point t1 to the time point t2, the integral capacitor Cg starts to receive the charging current and the discharging current from the charge/discharge control circuit 234. Obviously, since the discharging period of the integral capacitor Cg is longer than the charging period of the integral capacitor Cg, the voltage Vc of the integral capacitor Cg is gradually decreased during the second phase P2.

During the third phase P3 from the time point t2 to the time point t3, the voltage change ΔVc is lower than zero. Consequently, the trimming finish signal Trim_pass is inactivated. Under this circumstance, the average voltage Vavg of the pumping output signal Vpump is still lower than the target voltage Vtarget.

Similarly, during plural voltage detecting cycles from the time point t3 to the time point t4, the voltage change ΔVc is still lower than zero. Consequently, the trimming finish signal Trim_pass is inactivated. Under this circumstance, the average voltage Vavg of the pumping output signal Vpump is still lower than the target voltage Vtarget.

During the first phase P1 from the time point t4 to the time point t5, the integral capacitor Cg is pre-charged to the initial voltage Vinit.

During the second phase P2 from the time point t5 to the time point t6, the integral capacitor Cg starts to receive the charging current and the discharging current from the charge/discharge control circuit 234. Obviously, since the discharging period of the integral capacitor Cg is approximately equal to the charging period of the integral capacitor Cg, the voltage Vc of the integral capacitor Cg is maintained at the initial voltage Vinit.

During the third phase P3 from the time point t6 to the time point t7, the voltage change ΔVc is higher than zero. Consequently, the trimming finish signal Trim_pass is activated. Under this circumstance, the trimming process is finished, and the average voltage Vavg of the pumping output signal Vpump reaches the target voltage Vtarget.

In the above embodiment, the pumping output signal Vpump is gradually increased during the trimming process of the trimming circuit 290. However, those skilled in the art will readily observe that numerous modifications and alterations may be made while retaining the teachings of the invention. For example, in some other embodiments, the pumping output signal Vpump is gradually decreased to achieve the similar trimming efficacy.

From the above descriptions, the present invention provides a trimming circuit and a trimming method for a voltage generator. In accordance with the trimming circuit and the trimming method of the present invention, the relation between the average voltage Vavg of the pumping output signal Vpump and the target voltage Vtarget is realized, and the pumping output signal Vpump is continuously adjusted until the average voltage Vavg reaches the target voltage Vtarget.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A trimming circuit for a voltage generator, the voltage generator generating an output voltage according to a reference voltage, the trimming circuit comprising:

a controller receiving a control clock signal and a trimming finish signal, and generating a trimming code, wherein if the trimming finish signal is inactivated, the trimming code is gradually changed from an initial value by the controller according to the control clock signal, wherein if the trimming finish signal is activated, the trimming code is no longer changed;

a reference voltage supply circuit connected with the controller, and receiving the trimming code, wherein a fixed voltage is converted into the reference voltage by the reference voltage supply circuit according to the trimming code, wherein a magnitude of the reference voltage is in direct proportion to the trimming code; and an average voltage detector connected with the voltage generator, and receiving the output voltage and a target voltage, wherein the output voltage contains an average voltage in a DC form and a ripple voltage in an AC form, wherein when the average voltage reaches the target voltage, the trimming finish signal is activated by the average voltage detector.

2. The trimming circuit as claimed in claim 1, wherein the fixed voltage is a bandgap voltage generated by a bandgap reference circuit, wherein after the reference voltage supply circuit multiplies the fixed voltage by the trimming code, the reference voltage is generated.

3. The trimming circuit as claimed in claim 1, wherein the controller is a counter, and a counting value of the counter is the trimming code, wherein if the trimming finish signal is inactivated, the counting value is gradually changed from the initial value according to the control clock signal, wherein if the trimming finish signal is activated, the trimming code from the counter is no longer changed.

4. The trimming circuit as claimed in claim 1, wherein the average voltage detector comprises:

a first comparator receiving the output voltage and the target voltage, and comparing the output voltage with the target voltage, thereby generating an output pulse;

a charge/discharge control circuit connected with the first comparator, and receiving the output pulse, wherein the charge/discharge control circuit outputs a charging current in response to a first voltage level of the output pulse during a charging period, wherein the charge/discharge control circuit outputs a discharging current in response to a second voltage level of the output pulse during a discharging period;

an integral capacitor receiving the charging current and the discharging current; and a voltage change detector connected with the charge/discharge control circuit and the integral capacitor, wherein the trimming finish signal is activated according to a voltage change of the integral capacitor.

5. The trimming circuit as claimed in claim 4, wherein if the voltage change of the integral capacitor is increased to zero from a negative value, the trimming finish signal is activated.

6. The trimming circuit as claimed in claim 4, wherein the charge/discharge control circuit comprises:

a charging unit providing a first current;

a first switch element controlled according to the output pulse, wherein the first switch element is connected between the charging unit and a first node; and a discharging unit connected with the first node, and providing a second current;

wherein during the charging period, the charging current of the charge/discharge control circuit is obtained by subtracting the second current from the first current, wherein during the discharging period, the discharging current of the charge/discharge control circuit is equal to the second current, wherein the first current is two times the second current.

7. The trimming circuit as claimed in claim 6, wherein the voltage change detector comprises:
   a second comparator, wherein a first input terminal of the second comparator receives an initial voltage, a second input terminal of the second comparator is connected with a second node and the integral capacitor, and an output terminal of the second comparator generates the trimming finish signal;
   a second switch element connected between the first input terminal and the second input terminal of the second comparator;
   a third switch element connected between the first node and the second node; and
   a fourth switch element connected between an enabling terminal of the second comparator and a power supply voltage
   wherein only the second switch element is in a close state during a first phase of a voltage detecting cycle, only the third switch element is in the close state during a second phase of the voltage detecting cycle, and only the third switch element is in the close state during a third phase of the voltage detecting cycle.

8. The trimming circuit as claimed in claim 7, wherein the integral capacitor is pre-charged to the initial voltage during the first phase, the integral capacitor receives the charging current and the discharging current during the second phase, and the trimming finish signal is activated by the second comparator according to the voltage change of the integral capacitor during the third phase.

9. A trimming method for a voltage generator, the voltage generator generating an output voltage according to a reference voltage, the trimming method comprising steps of:
   (a) providing an initial value of a trimming code;
   (b) generating the reference voltage to the voltage generator according to the trimming code, so that the output signal is correspondingly generated by the voltage generator; and
   (c) comparing an average voltage of the output voltage with a target voltage, wherein if the average voltage does not reach the target voltage, the trimming code is gradually changed, and the step (b) is repeatedly done, wherein if the average voltage reaches the target voltage, the trimming code is locked.

10. The trimming method as claimed in claim 9, wherein a magnitude of the reference voltage is in direct proportion to the trimming code.

11. The trimming method as claimed in claim 9, wherein the step (c) comprises sub-steps of:
   (c1) comparing the output voltage with the target voltage, thereby generating an output pulse, wherein a charging current is generated in response to a first voltage level of the output pulse during a charging period, wherein a discharging current is generated in response to a second voltage level of the output pulse during a discharging period;
   (c2) allowing an integral capacitor to receive the charging current and the discharging current;
   (c3) if a voltage change of the integral capacitor is not zero, determining that the average voltage does not reach the target voltage; and
   (c4) if the voltage change of the integral capacitor is zero, determining that the average voltage reaches the target voltage.

* * * * *